United States Patent
Hauske et al.

(10) Patent No.: US 9,043,690 B2
(45) Date of Patent: May 26, 2015

(54) METHOD AND APPARATUS FOR DETECTING A PARITY ERROR IN A SEQUENCE OF DQPSK SYMBOLS OF A DIGITAL TRANSMISSION SYSTEM

(75) Inventors: Fabian Nikolaus Hauske, München (DE); Gerhard Bauch, München (DE); Doris Pflueger, München (DE)

(73) Assignee: Huawei Technologies Co., Ltd., Shenzhen (CN)

(*) Notice: Subject to any disclaimer, the term of this patent is extended or adjusted under 35 U.S.C. 154(b) by 581 days.

(21) Appl. No.: 13/494,436

(22) Filed: Jun. 12, 2012

(65) Prior Publication Data

US 2012/0290893 A1   Nov. 15, 2012

Related U.S. Application Data (63) Continuation of application No. PCT/CN2011/073878, filed on May 10, 2011.

(51) Int. Cl.
| | | |
|---|---|---|
| *G06F 11/00* | (2006.01) | |
| *H03M 13/00* | (2006.01) | |
| *H03M 13/37* | (2006.01) | |
| *H04L 1/00* | (2006.01) | |
| *H04L 27/233* | (2006.01) | |

(52) U.S. Cl.
CPC ...... *H03M 13/6325* (2013.01); *H03M 13/3746* (2013.01); *H04L 1/0045* (2013.01); *H04L 1/0063* (2013.01); *H04L 27/2331* (2013.01)

(58) Field of Classification Search
CPC ........... H03M 13/6325; H04L 27/2082; H04L 27/18; H04L 27/32
USPC ......... 714/746, 755, 758, 799, 800; 375/283, 375/279, 298, 329
See application file for complete search history.

(56) References Cited

U.S. PATENT DOCUMENTS

| | | | |
|---|---|---|---|
| 3,529,290 A | | 9/1970 | Schroeder et al. |
| 5,414,711 A | * | 5/1995 | Okada et al. ............. 714/704 |
| 6,304,614 B1 | * | 10/2001 | Abbaszadeh et al. ...... 375/279 |

(Continued)

FOREIGN PATENT DOCUMENTS

| | | |
|---|---|---|
| CN | 102577206 B | 7/2014 |
| WO | WO 2010/130595 A1 | 11/2010 |

OTHER PUBLICATIONS

Oh et al., Blind iterative channel estimation and LDPC decoding for OFDM Systems, 2005, IEEE, pp. 1 to 4.*

(Continued)

*Primary Examiner* — Shelly A Chase
(74) *Attorney, Agent, or Firm* — Slater & Matsil, L.L.P.

(57) ABSTRACT

The present disclosure relates to a method for detecting a parity error in a sequence of DQPSK symbols of a digital transmission system, comprising determining a first demodulated symbol $r_1$; determining a second demodulated symbol $r_2$; determining a first parity symbol $p_1$; determining a second parity symbol $p_2$; determining a super-parity symbol $q_1$; and detecting a parity error in the sequence of DQPSK symbols by comparing a combination of the first parity symbol $p_1$ and the second parity symbol $p_2$ against the super-parity symbol $q_1$, wherein a parity between two DQPSK symbols describes a phase difference between the two DQPSK symbols.

15 Claims, 7 Drawing Sheets

(56) References Cited

U.S. PATENT DOCUMENTS

| 6,427,219 | B1 | 7/2002 | Yang |
|---|---|---|---|
| 2002/0046382 | A1 | 4/2002 | Yang |
| 2008/0049876 | A1 | 2/2008 | Karam |
| 2008/0092022 | A1 | 4/2008 | Karam |
| 2012/0044098 | A1 | 2/2012 | Bellingrath |
| 2012/0290893 | A1 | 11/2012 | Hauske et al. |

OTHER PUBLICATIONS

Extended European Search Report received in Application No. 11844010.6-1906, Applicant: Huawei Technologies Co. Ltd., mailed Mar. 5, 2013, 5 pages.

Masamura, Tatsuro, "Intersymbol Interference Reduction for Differential MSK by Nonredundant Error Correction," IEEE Transactions on Vehicular Technology, vol. 39, No. 1, New York, US, Feb. 1990, 10 pages.

Masamura, Tatsuro, et al., "Differential Detection of MSK with Nonredundant Error Correction," IEEE Transactions on Communications, vol. Com 27. No. 6, Jun. 1979, 7 pages.

PCT International Search Report and the Written Opinion mailed Feb. 23, 2012, issued in related International Application No. PCT/CN2011/073878, Huawei Technologies Co., Ltd. (11 pages).

Calabro, S., et al., "Improved Detection of Differential Phase Shift Keying through Multi-Symbol Phase Estimation", *ECOC 2005 Proceedings*, vol. 3, Paper We4.P.118, pp. 737-738.

Divsalar, Dariush, et al., "Multiple-Symbol Differential Detection of MPSK", *IEEE Transactions on Communications*, vol. 38, No. 3, Mar. 1990, pp. 300-308.

Leib, Harry, "Data-Aided Noncoherent Demodulation of DPSK", *IEEE Transactions on Communications*, vol. 43, No. 2/3/4, Feb.-Apr. 1995, pp. 722-725.

Liu, Xiang, "Receiver Sensitivity Improvement in Optical DQPSK and DQPSK/ASK through Data-Aided Multi-Symbol Phase Estimation" Dec. 2006.

Piyawanno, Kittipong et al., "Correlation-Based Carrier Phase Estimation for WDM DP-QPSK Transmission", *IEEE Photonics Technology Letters*, vol. 20, No. 24, Dec. 15, 2008, pp. 2090-2092.

Van Den Borne, D., et al., "Differential Quadrature Phase Shift Keying with Close to Homodyne Performance Based on Multi-Symbol Phase Estimation", Organised by the *IEE Photonics Professional Network*, www.iee.org/events/opticalfibre.cfm, 12 pages. Sep. 2006.

* cited by examiner

METHOD AND APPARATUS FOR DETECTING A PARITY ERROR IN A SEQUENCE OF DQPSK SYMBOLS OF A DIGITAL TRANSMISSION SYSTEM

CROSS-REFERENCE TO RELATED APPLICATION

This application is a continuation of International Application No. PCT/CN2011/073878, filed on May 10, 2011, entitled "Method And Apparatus For Detecting A Parity Error In A Sequence Of DQPSK Symbols Of A Digital Transmission System", which is hereby incorporated herein by reference.

FIELD OF THE INVENTION

The present disclosure relates to error detection in DQPSK (Differential Quadrature Phase Shift Keying) communication systems.

BACKGROUND OF THE INVENTION

For digital transmission systems, in particular optical transmission systems, transmission is sensitive to noise. Differential decoding is used to reduce error bursts induced by phase slips. Soft differential (SD) decoding proves excellent tolerance against non-linear phase noise. Differential decoding, however, introduces a Bit Error Rate (BER) penalty in the B2B (Back-to-Back) transmission between a transmitting device and a receiving device. In the case of soft differential decoding, two consecutive values are multiplied before a decision is made. Thus, the total noise power is doubled, which translates into an (optical) signal-to-noise ratio degradation. To mitigate the differential decoding penalty, multi-symbol phase estimation (MSPE) methods are known. These methods, however, suffer from complex implementation. Alternatively, non-redundant error correction (NEC) is known as the classical scheme to mitigate the differential penalty. Non-redundant error correction, however, may deliver poor performance.

Differential encoding approximately doubles the error rate compared to ordinary M-PSK but this may be overcome by only a small increase in signal to noise ratio $E_b/N_0$. As there will be a physical channel between the transmitter and receiver in the communication system, this channel will, in general, introduce an unknown phase-shift to the PSI: signal. In these cases, the differential schemes can yield a better error-rate than the ordinary schemes which rely on precise phase information. For a signal that has been differentially encoded, there is an alternative method of demodulation. Instead of demodulating as usual and ignoring carrier-phase ambiguity, a phase between two successive received symbols is compared and used to detect the transmitted data. When differential encoding is used in this manner, the scheme is known as differential phase-shift keying (DPSK) or differential quadrature phase-shift keying (DQPSK).

SUMMARY OF THE INVENTION

One of the objects of the present disclosure is to provide an efficient concept for mitigating the differential decoding penalty exhibiting high performance and low complexity.

This object is achieved by the features of the independent claims. Further implementation forms are apparent from the dependent claims, the description and the figures.

The present disclosure relates to an efficient concept for mitigating the differential decoding penalty may be provided by a two-stage parity verification procedure. In a first stage, parity is generated upon the basis of a phase difference of two consecutive, demodulated symbols. In a second stage, a further parity, so called super-parity, is generated upon the basis of the parity generated in the first stage. Thus, not only the demodulation error but also a parity error may be detected and corrected.

According to a first aspect, the present disclosure relates to a method for detecting a parity error in a sequence of DQPSK symbols of a digital transmission system. The method comprises determining a first demodulated symbol $r_1$ as a parity between a first DQPSK symbol $x(n-2)$ and a second DQPSK symbol $x(n-1)$; determining a second demodulated symbol $r_2$ as a parity between the second DQPSK symbol $x(n-1)$ and a third DQPSK symbol $x(n)$, wherein the first $x(n-2)$, the second $x(n-1)$ and the third $x(n)$ DQPSK symbols are contiguous symbols of the sequence of DQPSK symbols; determining a first parity symbol $p_1$ as a parity between a fourth DQPSK symbol $x(n-k)$ and the third DQPSK symbol $x(n)$; determining a second parity symbol $p_2$ as a parity between a fifth DQPSK symbol $x(n-k-m)$ and the fourth DQPSK symbol $x(n-k)$, wherein the third $x(n)$, the fourth $x(n-k)$ and the fifth $x(n-k-m)$ DQPSK symbols are different and non-contiguous symbols of the sequence of DQPSK symbols; determining a super-parity symbol $q_1$ as a parity between the fifth DQPSK symbol $x(n-k-m)$ and the third DQPSK symbol $x(n)$; and detecting a parity error in the sequence of DQPSK symbols by comparing a combination of the first parity symbol $p_1$ and the second parity symbol $p_2$ against the super-parity symbol $q_1$, wherein a parity between two DQPSK symbols describes a phase difference between the two DQPSK symbols.

In differentially-encoded QPSK (DQPSK), the phase-shifts are 0°, 90°, 180°, −90° which corresponds to data symbols '00', '01', '11', '10'. Thus, the received symbols may be demodulated to one of the M points in the constellation and a comparator then computes the difference in phase between this received signal and the preceding one. The difference encodes the data.

Applying demodulation, detecting symbols and performing decoding on the encoded information bits is also referred to "hard-differential" (HD) decoding as the decoding operation employs hard-decision information like symbols or bits. Demodulation of the signal can be also performed by "soft-differential" (SD) decoding, which employs the soft-decision values to demodulate the signal and decode the signal in one step. The symbols and bits are detected thereafter. Thus, the method can for example perform a parity check based on the detected symbols after SD decoding.

According to the first aspect, a parity describing a phase difference between two DQPSK symbols is defined. Without loss of generality, a short definition of the phase difference between two DQPSK symbols is given hereinafter. Call the received symbol in the $k^{th}$ timeslot $r_k$ and let it have phase $\phi_k$. Assume without loss of generality that the phase of the carrier wave is zero. Denote the additional white gaussian noise (AWGN) term as $n_k$. Then $$r_k = \sqrt{E_s} e^{j\phi_k} + n_k.$$

The decision variable for the $k-1^{th}$ symbol and the $k^{th}$ symbol is the phase difference between $r_k$ and $r_{k-1}$. That is, if $r_k$ is projected onto $r_{k-1}$, the decision is taken on the phase of the resultant complex number:

$$r_k r_{k-1}^* = E_s e^{j(\theta_k - \theta_{k-1})} + \sqrt{E_s} e^{j\theta_k} n^*_{k-1} + \sqrt{E_s} e^{-j\theta_{k-1}} n_k + n_k n_{k-1}^*$$

where superscript * denotes complex conjugation. In the absence of noise, the phase of this is $\theta_k - \theta_{k-1}$, the phase-shift or phase difference, respectively, between the two received signals which can be used to determine the data transmitted.

Using DQPSK avoids the need for possibly complex carrier-recovery schemes to provide an accurate phase estimate and is used as an attractive alternative to ordinary PSK. A constant or slowly time-varying carrier phase offset is cancelled by this method and carrier frequency offset translates into a constant phase offset such that low carrier frequency offsets can be tolerated with only minor penalty. Therefore, a carrier frequency synchronization before SD decoding may be performed but is not necessary.

In optical communications systems, DQPSK symbols may be deployed, since data may be modulated onto the phase of a laser in a differential way. The modulation may be performed by a laser which emits a continuous wave, and a Mach-Zehnder modulator which receives electrical binary data. For the case of BPSK, the laser transmits the field unchanged for binary '1', and with reverse polarity for '0'. In the receiver, the signal is down-converted from the carrier wavelength of the transmit laser into the base band by intradyne coherent detection. A local laser (LO) is mixed with the received signal in a 90°-hybrid, where the carrier wavelength of the LO and the received signal are similar but not identical. Typically, LO frequency offset up to 3 GHz might be present. This intradyne coherent receiver requires digital demodulation to synchronize the carrier phase and the carrier frequency, as a phase-locked loop controlling the LO carrier phase and frequency is not applicable with existing technology. The output of the 90°-hybrid provides the inphase and quadrature component (also referred to as real and imaginary part) of the base band signal, which is converted into an electrical signal. After analogue-to-digital conversion, we obtain a discrete digital representation of the optical base band signal, which can be utilized for digital synchronization and equalization. Also polarization-diverse intradyne coherent detection is widely applied, which also transfers the polarization properties of the optical signal into the digital domain.

Typically, several stages of digital equalization and synchronization are applied to the received signal such as chromatic dispersion compensation, timing recovery and adaptive filters to mitigate polarization effects, e.g. finite impulse response filters (FIR) to perform time-domain equalization (TDEQ). After equalization, typically one discrete, complex valued signal per polarization can be obtained, which is referred to as $x(n)$ and $y(n)$ respectively.

Finally, the remaining carrier frequency and carrier phase-offset, including all kinds of phase noise from linear and nonlinear optical impairments, laser linewidth or laser phase noise, has to be recovered. This digital demodulation might be performed in a carrier recovery stage including carrier phase estimation. Instead, also SD decoding may be performed as a low-complexity alternative, which requires differential encoding of the data at the transmitter.

Coherent optical receivers are disclosed in C. R. S. Fludger, T. Duthel, D. van den Borne, C. Schulien, E.-D. Schmidt, T. Wuth, J. Geyer, E. De Man, G. D. Khoe, and H. de Waardt, "Coherent equalisation and POLMUX-RZ-DQPSK for robust 100-GE transmission," J. Lightw. Technol., vol. 26, no. 1, pp. 64-72, January 2008, which document is incorporated herein by reference.

According to an alternative implementation form, differentially-encoded binary phase-shift keying (DBPSK) symbols are used instead of DQPSK symbols. In differentially-encoded BPSK a binary '1' may be transmitted by adding 180° to the current phase and a binary '0' by adding 0° to the current phase.

According to the first aspect, a parity error and parity symbols are defined. A parity bit is a bit that is added to ensure that the number of bits with the value one in a set of bits is even or odd. Parity bits are used for implementing error detecting codes. There are two variants of parity bits: even, parity bit and odd parity bit. When using even parity, the parity bit is set to 1 if the number of ones in a given set of bits not including the parity bit is odd, making the entire set of bits including the parity bit even. When using odd parity, the parity bit is set to 1 if the number of ones in a given set of bits (not including the parity bit) is even, keeping the entire set of bits (including the parity bit) odd. In other words, an even parity bit will be set to "1" if the number of 1's +1 is even, and an odd parity bit will be set to "1" if the number of 1's+1 is odd. If an odd number of bits including the parity bit are transmitted incorrectly, the parity bit will be incorrect and thus indicates that an error occurred in transmission. This mechanism enables the detection of single bit errors, because if one bit gets flipped due to line noise, there will be an incorrect number of ones in the received data.

According to the first aspect, a first parity symbol is defined as a parity between two non-contiguous DQPSK symbols $x(n-k)$ and $x(n)$, wherein non-contiguousness requires that k is an integer number outside the range $[-1, 0, 1]$. According to the first aspect, a second parity symbol is defined as a parity between two non-contiguous DQPSK symbols $x(n-k-m)$ and $x(n-k)$, wherein non-contiguousness requires that m is an integer number outside the range $[-1, 0, 1]$.

According to the first aspect, a super-parity symbol is defined as a parity between two DQPSK symbols $x(n-k-m)$ and $x(n)$, wherein the first DQPSK symbol $x(n-k-m)$ is the symbol which has been used for determining a first parity symbol and the second DQPSK symbol $x(n)$ is the symbol which has been used for determining a second parity symbol which is non-contiguous to the first parity symbol. According to an implementation form, (k+m) is an integer number outside the range $[-3,-2,-1,0,1,2,3]$.

According to the first aspect, a first demodulation symbol is defined as a parity describing a phase difference between a first DQPSK symbol $x(n-2)$ and a second DQPSK symbol $x(n-1)$, wherein both DQPSK symbols are contiguous symbols of the sequence of DQPSK symbols. A second demodulated symbol is defined as a parity between the second DQPSK symbol $x(n-1)$ and a third DQPSK symbol $x(n)$, wherein both DQPSK symbols are contiguous symbols of the sequence of DQPSK symbols. According to an implementation form, the first parity symbol is defined as parity between three contiguous DQPSK symbols which define two demodulated symbols. According to an implementation form, the super-parity symbol is defined as parity between five contiguous DQPSK symbols which define two non-contiguous parity symbols.

According to the first aspect, a digital transmission system is defined. According to an implementation form, the digital transmission system is a system used for transmission in wireless networks, in particular in GSM/UMTS/LTE cellular networks and WLAN. According to an alternative implementation form, the digital transmission system is a system used for transmission in wired networks, operating in a circuit-switched or packet-switched manner. According to an implementation form, the digital transmission system is IP-based, ATM-based or TDM-based. According to an implementation form, the digital transmission system is an XDSL network. According to an implementation form, the digital transmission system is an optical transmission system. According to an implementation form, the digital transmission system is an electrical transmission system. According to an implementation form, the digital transmission system provides optical and electrical transmission.

According to the first aspect, phase differences between DQPSK symbols are easy to calculate such that the method provides a low complexity. By using super-parity symbols the method provides a mechanism to detect errors in parity symbols which may be corrected before detection of errors in the sequence of DQPSK symbols is initiated. Thus, the method provides an efficient mechanism for mitigating the differential decoding penalty while exhibiting high performance and low complexity.

According to a first implementation form of the first aspect, the parity between two DQPSK symbols is determined by a threshold decision applied to a product of a first of the two DQPSK symbols and a complex conjugate of a second of the two DQPSK symbols. The parity $p_{n,k}$ between two DQPSK symbols $x(n)$ and $x(k)$ is defined as $p_{n,k}=HD(x(n) x^*(k))$, wherein HD is a threshold decision to obtain the hard-decision symbols for detecting the phase of $x(n) x^*(k)$. For DPQKS, $p_{n,k}$ may be represented by binary two-bit words 00,01,10,and 11 referring to decimal values 0,1, 2, and 3, respectively.

According to a second implementation form of the first aspect, the parity between two non-contiguous DQPSK symbols of a sequence of DQPSK symbols is determined by a sum of sub-parities which are parities between individual symbols ranging from a first of the two non-contiguous DQPSK symbols to a second of the two non-contiguous DQPSK symbols. Two non-contiguous DQPSK symbols are symbols which are not contiguous or adjacent, that is, other DQPSK symbols are in between the two non-contiguous symbols. According to some implementation form of the first aspect, two non-contiguous DQPSK symbols $x(n)$ and $x(k)$ include the sequence of DQPSK symbols $x(a), x(b), \ldots x(z)$, wherein $n<a<b< \ldots <z<k$. According to some implementation form, the sub-parities $p_{n,a}=x(n)x^*(a)$, $p_{a,b}=x(a)x^*(b)$, $p_{b,c}=x(b)x^*(c), \ldots p_{z,k}=x(z)x^*(k)$ are formed from individual symbols ranging from a first $x(n)$ of the two non-contiguous DQPSK symbols to a second $x(k)$ of the two non-contiguous DQPSK symbols. However, also $p_{n,a}=HD(x(n)x^*(a))$ can be formed for all subsequent sub-parities.

The parity $p_{n,k}$ between the two non-contiguous DQPSK symbols $x(n)$ and $x(k)$ may be expressed as the sum of the individual sub-parities: $p_{n,k}=p_{n,a}+p_{a,b}+p_{b,c}+ \ldots +p_{z,k}$. Thus, more than two sub-parities may be utilized for forming the parity check. Therefore, $p_{n,k}$ can be deployed to check a sum of the sub-parities, wherein each sub-parity may be formed by a corresponding phase difference.

According to some implementation forms, any combination of sub-parities may be used for performing the parity check.

According to some implementation form, the parity may be formed as a sum of sub-parities, $p_{n,k}=p_{n,a}+p_{a,k}$. According to some implementation form, the parity is formed as $p_{n,k}=p_{n,a}+p_{a,b}+p_{b,z}$. According to some implementation form, the parity is formed as $p_{n,k}=p_{n,b}+p_{b,y}+p_{y,k}$. Step-sizes between two of the individual symbols used for determining the sub-parities $p_{n,a}, p_{a,b}, p_{b,c}, \ldots, p_{z,k}$ are determined as a-n, b-a, c-b, ... and k-z. Therefore, $p_{n,k}$ can be deployed to check a sum of the sub-parities, wherein each sub-parity may be formed by a corresponding phase difference.

According to a third implementation form of the first aspect, a step-size between two of the individual symbols used for determining the sub-parities differs for at least two of the sub-parities. According to some implementation form, the parity may be expressed as $p_{n,k}=p_{n,a}+p_{a,k}$, wherein the step-size between the individual symbol $x(n)$ and the individual symbol $x(a)$ is a-n and the step-size between the individual symbol $x(a)$ and the individual symbol $x(k)$ is k-a. According to the third implementation form, a-n differs from k-a.

According to a fourth implementation form of the first aspect, a number of sub-parities for determining a parity between the fourth DQPSK symbol $x(n-k)$ and the third DQPSK symbol $x(n)$ is equal to a number of sub-parities for determining a parity between the fifth DQPSK symbol $x(n-k-m)$ and the fourth DQPSK symbol $x(n-k)$.

The parity between $x(n-k)$ and $x(n)$ can for example be formed by the three sub-parities $p_{n-k}, p_{a,b}$ and $p_{b,n}$ as $p_{n-k,n}=p_{n-k,a}+p_{a,b}+p_{b,n}$ and the parity between $x(n-k-m)$ and $x(n-k)$ is formed by the three sub-parities $p_{n-k-m,c}, p_{c,d}$ and $p_{d,n-k}$ as $p_{n-k-m,n-k}=p_{n-k-m,c}+p_{c,d}+p_{d,n-k}$. In this implementation form, the number of sub-parities for forming both parities is equal:

According to a fifth implementation form of the first aspect, a number of sub-parities for determining a parity between the fifth DQPSK symbol $x(n-k-m)$ and the third DQPSK symbol $x(n)$ is an integer multiple of a number of sub-parities for determining a parity between the fourth DQPSK symbol $x(n-k)$ and the third DQPSK symbol $x(n)$.

The parity between $x(n-k)$ and $x(n)$ can for example be formed by the two sub-parities $p_{n-k,a}$, and $p_{a,n}$ as $p_{n-k,n}=p_{n-k,a}+p_{a,n}$ and the parity between $x(n-k-m)$ and $x(n)$ is formed by the four sub-parities $p_{n-k-m,b}, p_{b,c}, p_{c,d}$ and $p_{d,n}$ as $p_{n-k-m,n}=p_{n-k-m,b}+p_{b,c}+p_{c,d}+p_{d,n}$. In this implementation form, the number of sub-parities for forming the parity between $x(n-k-m)$ and $x(n)$ is an integer multiple of the number of sub-parities for forming the parity between $x(n-k)$ and $x(n)$.

A number k of symbols from the fourth DQPSK symbol $x(n-k)$ to the third DQPSK symbol $x(n)$ in the sequence of DQPSK symbols can for example be equal to a number m of symbols front the fifth DQPSK symbol $x(n-k-m)$ to the fourth DQPSK symbol $x(n-k)$ in the sequence of DQPSK symbols. Parity symbols are calculated over the same number of DQPSK symbols. According to another implementation form of the first aspect, parity symbols are calculated over a different number of DQPSK symbols.

A number m+k of symbols from the fifth DQPSK symbol $x(n-k-m)$ to the third DQPSK symbol $x(n)$ in the sequence of DQPSK symbols can for example be a multiple of the number k of symbols from the fourth DQPSK symbol $x(n-k)$ to the third DQPSK symbol $x(n)$ in the sequence of DQPSK symbols. Parity symbols are calculated over different numbers of DQPSK symbols, wherein a first section of the sequence of DQPSK symbols comprises is a multiple number of symbols with reference to a second section of the sequence of DQPSK symbols.

The variable k is for example equal to 2 and m is equal to 2. Parity symbols are calculated over non-contiguous DQPSK symbols which are contiguous to further DQPSK symbols in between the non-contiguous DQPSK symbols.

According to a sixth implementation form of the first aspect, detecting a parity error comprises determining a first syndrome $s_1$ as a function of the first parity symbol $p_1$, the second parity symbol $_1)_2$ and the super-parity symbol $q_1$, wherein a parity error is detected if the first syndrome $s_1$ is unequal to zero. According to some implementation form, the first syndrome $s_1$ is determined as the modulo 4 operation of the sum of the first parity symbol $p_1$ and the second parity symbol $p_2$ subtracted by the first super-parity symbol $q_1$:

$s_1=p_1+p_2-q_1 \bmod 4.$

If the syndrome is not 0, a parity error is detected.

According to a seventh implementation form of the first aspect, a second syndrome s2 is determined as a function of the second parity symbol $p_2$, a third parity symbol $p_3$ and a second super-parity symbol $q_2$, wherein a parity error is detected if the second syndrome $s_2$ is unequal to zero; and the parity error is corrected by using the first syndrome $s_1$ and the second syndrome $s_2$. According to some implementation form, the second syndrome $s_2$ is determined as the modulo 4 operation of the sum of the second parity $p_2$ and a third parity symbol $p_3$ subtracted by the second super-parity symbol $q_2$:

$$s_2 = p_2 + p_3 - q_2 \bmod 4.$$

If the syndrome is not 0, an error is detected.

According to an eighth implementation form of the first aspect, the parity error is corrected by a non-redundant Error Correction.

The first syndrome $s_1$ can for example be determined as the modulo 4 operation of the sum of the first parity symbol $p_1$ and the second parity symbol $p_2$ subtracted by the first super-parity symbol $q_1$:

$$s_1 = p_1 + p_2 - q_1 \bmod 4.$$

and the second syndrome $s_2$ is determined as the modulo 4 operation of the sum of the second parity $p_2$ and a third parity symbol $p_3$ subtracted by the second super-parity symbol $q_2$:

$$s_2 = p_2 + p_3 - q_2 \bmod 4.$$

For a single error, the two consecutive syndromes $s_1$ and $s_2$ have the same value, as $p_2$ occurs both in $s_1$ and in $s_2$. So if $s_1 = s_2 \square 0$, an error has occurred in $p_2$ and can be corrected.

Non-redundant error correction is described in U.S. Pat. No. 3,529,290 and K. Piyawanno, M. Kuschnerov, F. N. Hauske, et al., "Correlation-Based Carrier Phase Estimation for WDM DP-QPSK Transmission," IEEE Photon. Technol. Len., vol. 20, no. 24, pp. 2090-2092, 2008 with respect to error correction of symbol errors exploiting phase differences of contiguous DPSK symbols, which is incorporated herein by reference. According to the seventh implementation form of the first aspect, non-redundant error correction is applied to error correction of parity errors exploiting phase differences of non-contiguous DQPSK symbols.

According to a ninth implementation form of the first aspect, the method further comprises detecting a demodulation error in the sequence of DQPSK symbols in which the parity error has been corrected by comparing a combination of the first demodulated symbol $r_1$ and the second demodulated symbol $r_2$ against the first parity symbol $p_1$. A demodulation error describes an error in the sequence of DQPSK symbols.

According to a tenth implementation form of the first aspect, the method further comprises determining a second super-parity symbol $q_2$ as a parity between a sixth DQPSK symbol $x(n-k-m-q)$ and the fifth DQPSK symbol $x(n-k-m)$; determining a hyper-parity symbol $v_1$ as a parity between the sixth DQPSK symbol $x(n-k-m-q)$ and the third DQPSK symbol $x(n)$; and detecting a super-parity error in the sequence of DQPSK symbols by comparing a combination of the super-parity symbol $q_1$ and the second super-parity symbol $q_2$ against the hyper-parity symbol $v_1$. The hyper-parity symbol is used to detect a super-parity error in the super-parity symbols. This super-parity error is to be corrected before the parity symbols are determined in order to have error-free parity symbols. Further, the super-parity symbol is used to detect a parity error in the parity symbols. This parity error is to be corrected before the demodulated symbols are determined in order to have error-free demodulated symbols.

According to an eleventh implementation form of the first aspect, the super-parity error is first corrected by Non-redundant Error Correction; then the parity error is corrected by Non-redundant Error Correction and at last the demodulation error is corrected by Non-redundant Error Correction.

According to a second aspect, the present disclosure relates to an apparatus for detecting a parity error in a sequence of DQPSK symbols of a digital transmission system, comprising a determination unit configured to determine a first demodulated symbol $r_1$ as a parity between a first DQPSK symbol $x(n-2)$ and a second DQPSK symbol $x(n-1)$, configured to determine a second demodulated symbol $r_2$ as a parity between the second DQPSK symbol $x(n-1)$ and a third DQPSK symbol $x(n)$, wherein the first $x(n-2)$, the second $x(n-1)$ and the third $x(n)$ DQPSK symbols are contiguous symbols of the sequence of DQPSK symbols; wherein the determination unit is further configured to determine a first parity symbol $p_1$ as a parity between a fourth DQPSK symbol $x(n-k)$ and the third DQPSK symbol $x(n)$, configured to determine a second parity symbol $p_2$ as a parity between a fifth DQPSK symbol $x(n-k-m)$ and the fourth DQPSK symbol $x(n-k)$, wherein the third $x(n)$, the fourth $x(n-k)$ and the fifth $x(n-k-m)$ DQPSK symbols are different and non-contiguous symbols of the sequence of DQPSK symbols; and configured to determine a super-parity symbol $q_1$ as a parity between the fifth DQPSK,symbol $x(n-k-m)$ and the third DQPSK symbol $x(n)$; and a detection unit configured to detect a parity error in the sequence of DQPSK symbols by comparing a combination of the first parity symbol $p_1$ and the second parity symbol $p_2$ against the super-parity symbol $q_1$, wherein a parity between two DQPSK symbols describes a phase difference between the two DQPSK symbols.

According to a first implementation form of the second aspect, the apparatus further comprises a correction unit configured to correct the parity error in the sequence of DQPSK symbols by Non-redundant Error Correction.

According to a second implementation form of the second aspect, the detection unit is configured to detect a demodulation error in the sequence of DQPSK symbols by comparing a combination of the first demodulated symbol $r_1$ and the second demodulated symbol $r_2$ against the first parity symbol $p_1$. The correction unit is configured to correct the demodulation error by Non-redundant Error Correction.

According to fourth implementation form of the second aspect, an apparatus for error detection and correction for digital (optical) transmission systems with soft differential decoding is provided comprising: calculating parities from non-adjacent symbols and detecting erroneous symbol patterns, combining the parities of non-adjacent and adjacent symbols to detect erroneous symbol patterns and to correct erroneous decisions, providing soft information about erroneous symbols to forward error correction (FEC) and switching between enhanced scheme and state of the art scheme.

For a low-cost, coherent detection receiver, e.g. a coherent single-polarization (SP) 40G DQPSK receiver, according to an implementation form of the second aspect, SD (soft differential) decoding allows to remove the carrier recovery. This reduces the complexity of the DSP tremendously by less gate count, less power consumption and less latency. The combination of SD decoding with the improved NEC and no carrier recovery, according to implementation forms of the second aspect, results in a low cost system. The calculated parities detect certain error patterns and mark them as erroneous. Some of those error patterns but not necessarily all are corrected by the non-redundant error correction according to implementation forms of the second aspect. According to some implementation forms of the second aspect, the information is provided to subsequent forward error correction units (FEC) as additional soft information to pre-determine erroneous error patterns. Thus, non-redundant error correction (NEC) improves forward error correction (FEC). Apparatuses, according to implementation forms of the second aspect, are compatible with any existing DSP structure. They provide improved mitigation of the SD penalty with low complexity.

BRIEF DESCRIPTION OF THE DRAWINGS

Further embodiments of the present disclosure will be described with respect to the following figures, in which.

DETAILED DESCRIPTION OF EMBODIMENTS OF THE INVENTION

Figure 1:
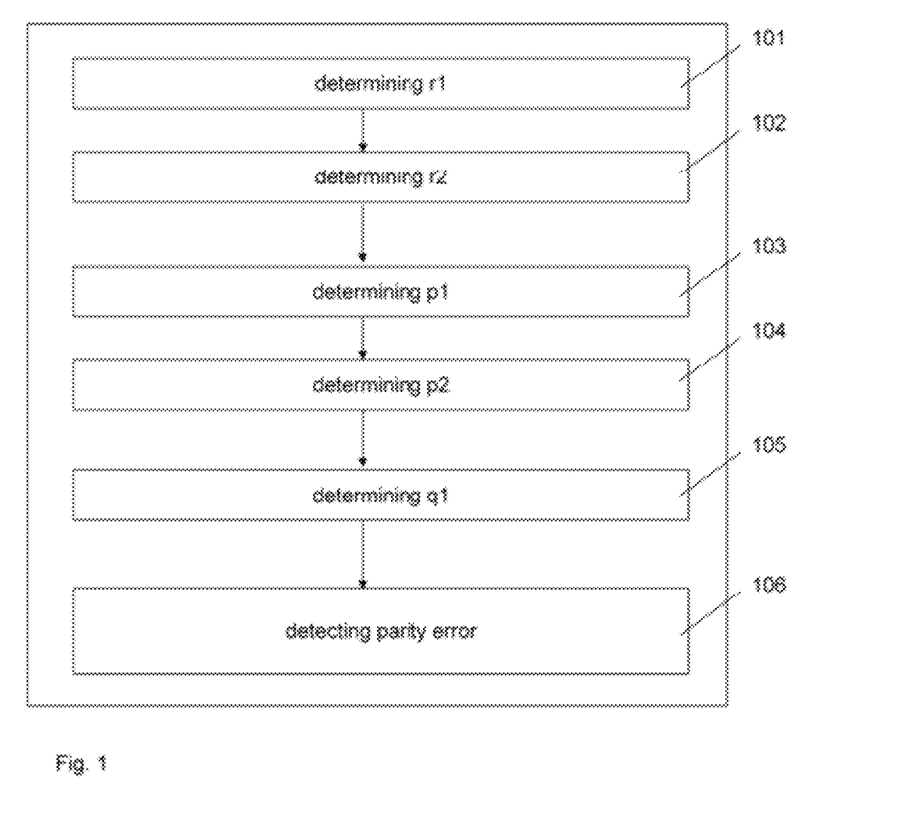
FIG. 1 shows a block diagram of a method for detecting a parity error in a sequence of DQPSK symbols according to an implementation form.

FIG. 1 shows a block diagram of a method for detecting a parity error in a sequence of DQPSK symbols according to an implementation form. The method comprises a first step 101 "determining r1 as parity between $x(n-2)$ and $x(n-1)$" and a second step 102 "determining r2 as parity between $x(n-1)$ and $x(n)$", wherein $x(n-2)$, $x(n-1)$, $x(n)$ are contiguous symbols of a sequence of DQPSK symbols. According to this implementation form, step 101 is performed before step 102. According to an other implementation form, step 102 is performed before step 101. The method comprises a third step 103 "determining p1 as parity between $x(n-k)$ and $x(n)$" and a fourth step 104 "determining p2 as parity between $x(n-k-m)$ and $x(n-k)$", wherein $x(n)$, $x(n-k)$, $x(n-k-m)$ are non-contiguous symbols of the sequence of DQPSK symbols. According to this implementation form, step 103 is performed before step 104. According to another implementation form, step 104 is performed before step 103. According to this implementation form, steps 101 and 102 are performed before steps 103 and 104. According to an other implementation form, steps 103 and 104 are performed before steps 101 and 102. The method comprises a fifth step 105 "determining q1 as parity between $x(n-k-m)$ and $x(n)$" and a sixth step 106 "detecting parity error by comparing combination of p1 and p2 against q1". A parity between two DQPSK symbols describes a phase difference between the two DQPSK symbols. According to this implementation form, step 105 is performed after steps 101 to 104. According to another implementation form, step 105 is performed before steps 101 to 104 or in between steps 101 to 104.

Figure 2:
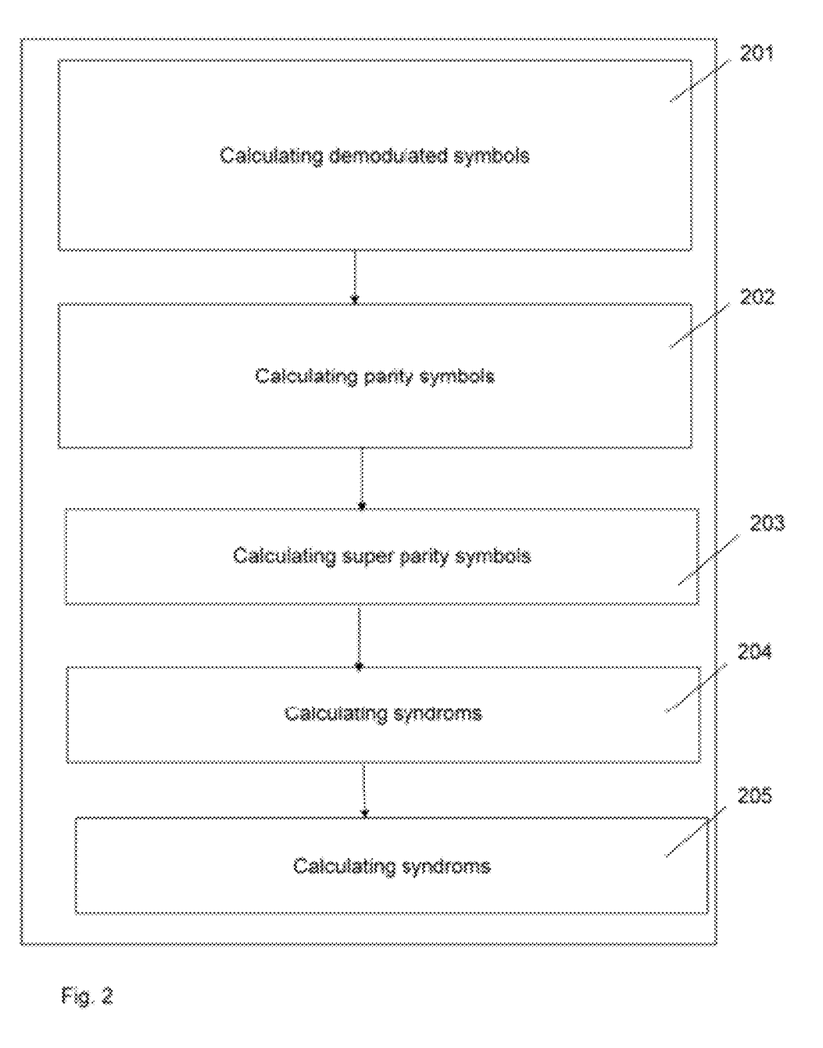
FIG. 2 shows a block diagram of a method for detecting a parity error in a sequence of DQPSK symbols according to an implementation form.

FIG. 2 shows a block diagram of a method for detecting a parity error in a sequence of DQPSK symbols according to an implementation form. The method comprises calculating 201 the demodulated symbols $r(n)$ "$r(n-1)=x(n-2)\ x^*(n-1)$; $r(n)=x(n-1)\ x^*(n)$; $r(n+1)=x(n)\ x^*(n+1)$; $r(n+2)=x(n+1)\ x^*(n+2)$", wherein $x(n-2)$, $x(n-1)$, $x(n)$, $x(n+1)$, $x(n+2)$, $x(n+3)$, $x(n+4)$ are contiguous symbols of a sequence of DQPSK symbols. The method comprises calculating 202 parity symbols $p(n)$ "$p(n)=x(n-2)\ x^*(n)$; $p(n+2)=x(n)\ x^*(n+2)$; $p(n+4)=x(n+2)\ x^*(n+4)$", wherein $x(n-2)$, $x(n)$, $x(n+2)$, $x(n+4)$ are non-contiguous symbols of the sequence of DQPSK symbols. The method comprises calculating 203 super-parity symbols $q(n)$ "$q(n)=x(n-2)\ x^*(n+2)$; $q(n+2)=x(n)\ x^*(n+4)$", calculating 204 the syndromes $s(n)$, $s(n+2)$ and performing error correction with respect to parity errors "$s(n)=p(n+2)+p(n)-q(n)\ \mathrm{mod}\ 4$; $s(n+2)=p(n+4)+p(n+2)-q(n+2)\ \mathrm{mod}\ 4$; if $s(n)=s(n+2)\neq 0$-->correct parity error in DQPSK symbols" and calculating 205 the syndromes $s(n)$ and $s(n+1)$ and performing error correction with respect to the DQPSK symbols "$s(n)=r(n)+r(n-1)-p(n)\ \mathrm{mod}\ 4$; $s(n+1)=r(n+1)+r(n)-p(n+1)\ \mathrm{mod}\ 4$; if $s(n)=s(n+1)\neq 0$-->correct demodulation error in DQPSK symbols". The sequence of the method steps is not fixed to the sequence of this implementation form. In other implementation forms a different sequence is used.

Figure 3:
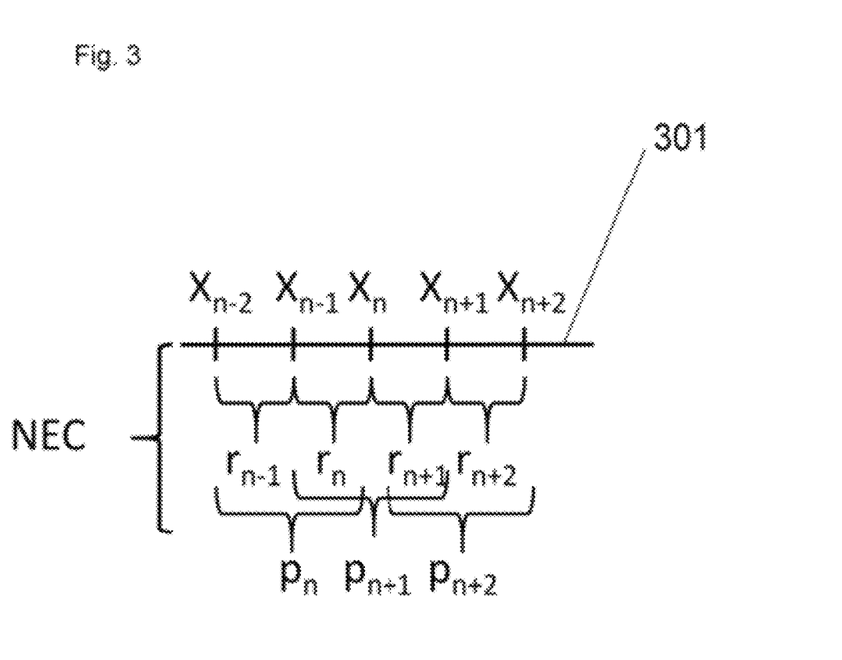
FIG. 3 shows a diagram for assigning DQPSK symbols to demodulation and parity symbols according to an implementation form.

FIG. 3 shows a diagram for assigning DQPSK symbols to demodulation and parity symbols according to an implementation form. The Figure depicts a sequence of DQPSK symbols 301 comprising the symbols $x_{n-2}, x_{n-1}, x_n, x_{n+1}$ and $x_{n+2}$, which are contiguous symbols of the sequence of DQPSK symbols 301. A sequence of demodulation symbols $r_{n-1}, r_n, r_{n+1}, r_{n+2}$ is generated by the sequence of DQPSK symbols 301 according to the following relations: $r_{n-1}=x_{n-2}x^*_{n-1}$, $r_n=x_{n-1}x^*_n$, $r_{n+1}=x_nx^*_{n+1}$, $r_{n+2}=x_{n+1}x^*_{n+2}$. A sequence of parity symbols $p_n$, $p_{n+1}$ and $p_{n+2}$ is generated by the sequence of DQPSK symbols 301 according to the following relations: $p_n=x_{n-2}x^*_n$, $p_{n|1}=x_{n-1}\ x^*_{n|1}$, $p_{n|2}=x_nx^*_{n+2}$. While the demodulation symbols are calculated from contiguous symbols of the sequence of DQPSK symbols, the parity symbols are calculated from non-contiguous symbols of the sequence of DQPSK symbols. A non-redundant error correction (NEC) algorithm is used for detecting and correcting errors in the sequence of demodulated symbols $r_{n-1}, r_n, r_{n+1}, r_{n+2}$. This non-redundant error correction algorithm supposes the parity symbol $p_n$ to be correct. But this is not guaranteed. Thus, errors might be introduced to the demodulated symbol $r_n$ instead of being corrected.

According to an implementation form, before performing the non-redundant error correction algorithm, the parity symbols $p_n$ may be corrected. This is achieved by calculating super parity symbols $q_n$ which are used for correcting parity errors in the sequence of DQPSK symbols. Therefore, the non-redundant error correction algorithm is in a first step applied to the parity symbols $p_n$ and the super-parity symbols $q_n$ and in a second step applied to the demodulated symbols $r_n$ and the corrected parity symbols $p_n$ which results in a higher performance.

Figure 4:
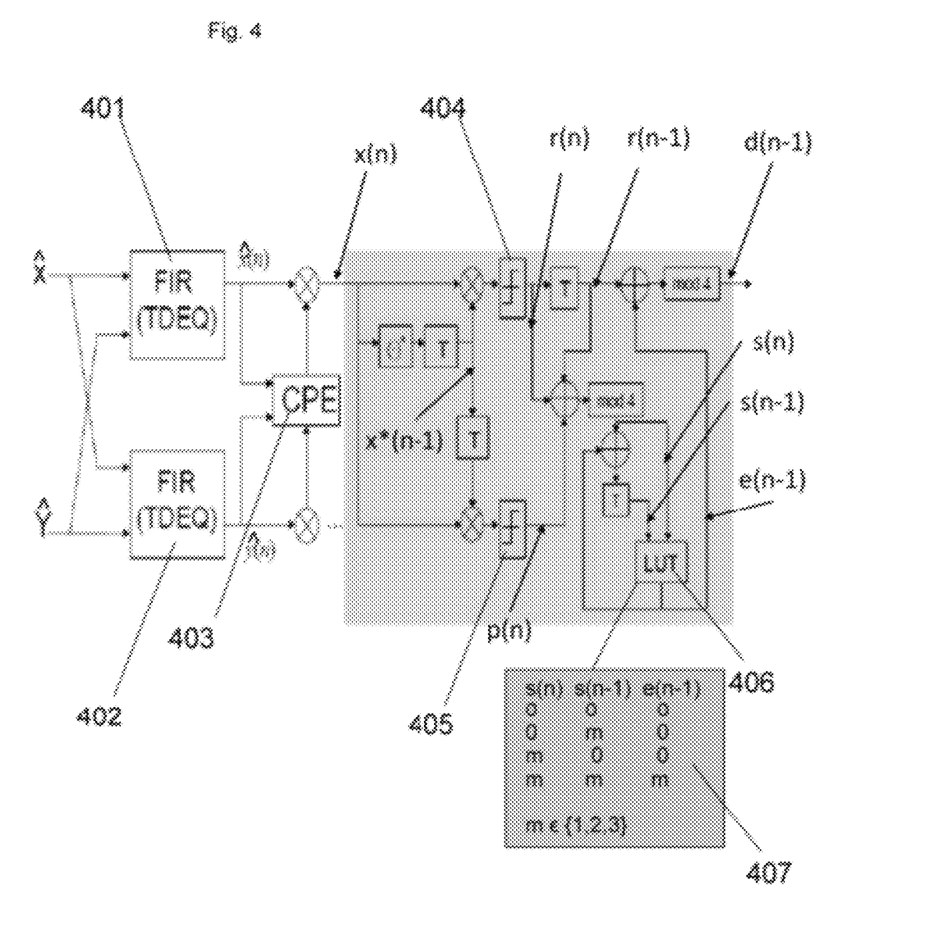
FIG. 4 shows a block diagram of a device for implementing an assignment of DQPSK symbols to demodulation and parity symbols according to an implementation form.

FIG. 4 shows a block diagram of a device for implementing an assignment of DQPSK symbols to demodulation and parity symbols according to an implementation form. The device comprises a first FIR filter 401 for time domain equalization which receives a first signal $\hat{X}$ at a first input and a second signal $\hat{Y}$ at a second input and provides a signal $\hat{x}\ (n)$ at an output. The device comprises a second FIR filter 402 for time domain equalization which receives the first signal $\hat{X}$ at a first input and the second signal $\hat{Y}$ at a second input and provides a signal $\hat{y}\ (n)$ at an output. The device can comprise an carrier phase estimation (CPE) unit 403 receiving the signals $\hat{x}\ (n)$ and ŷ (n) and providing an estimate of the carrier phase at an output. The carrier phase estimate provided at the output of the carrier phase estimation unit 403 is multiplied by $\hat{x}$ (n) resulting in the DQPSK symbol x(n). The same applies for the signals $\hat{Y}$, ŷ (n) and y(n) vice versa.

After complex conjugation of x(n) and time delay by the delay time T, the DQPSK symbol x*(n−1) is obtained. x*(n−1) is multiplied by x(n) and the phase of the product is detected in a phase detector 404 obtaining a demodulated symbol r(n). Delaying the demodulated symbol r(n) by the delay time T results in the demodulated symbol r(n−1). Multiplication of the DQPSK symbol x(n) with the DQPSK symbol x*(n−1) delayed by the delay time T, i.e. multiplication with the DQPSK symbol x*(n−2), and phase detection in a phase detector 405 results in the parity symbol p(n). The syndrome s(n) is obtained by adding the demodulated symbols r(n) and r(n−1), subtracting the parity symbol p(n) and applying a modulo 4 operation to the resulting term. The syndrome s(n−1) is obtained by the syndrome s(n) added to an error e(n−1) and delayed by the delay time T. A decision logical unit 406 (LUT) receives the first syndrome s(n) and the second syndrome s(n−1) as inputs and provides the error e(n−1) as output. The decision logical unit 406 detects the error symbol e(n−1) by recognition of the syndrome pattern as shown in table 407 illustrating the relation between the first syndrome s(n), the second syndrome s(n−1) and the error e(n−1). The number m includes the elements 1, 2, 3. The desired signal d(n−1) is obtained by adding the demodulated symbol r(n−1) and the error e(n−1) and applying a modulo 4 operation to the result.

According to an implementation form, the non-redundant error correction algorithm receives DQPSK symbols $x_n$ after optional equalization and carrier recovery. It first performs the soft demodulation $r_n = x_n x^*_{n-1}$, which gives the phase difference of two consecutive symbols. Then, the phase difference between symbol $x_n$ and $x_{n-2}$ is calculated as $p_n = x_n x^*_{n-2}$, which has the function of a parity symbol. For both, $r_n$ and $p_n$, a hard decision is performed and they are mapped to a number between 0 and 3. In case of no error the sum of the differences $r_n$ and $r_{n-1}$ is the same as $p_n$. Thus, in case of no error $s_n = r_n + r_{n-1} - p_n$ mod 4=0. So, $s_n = r_n + r_{n-1} - p_n$ mod 4 is used as a syndrome for the error. If the syndrome $s_n$ is not 0, an error is detected. As every $r_n$ occurs in $s_n = r_n + r_{n-1} - p_n$ mod 4 and $s_{n+1} = r_{n+1} + r_n - p_{n+1}$ mod 4, for a single error two consecutive syndromes have the same value. So, if $s_n = s_{n+1} \neq 0$, an error has occurred in $r_n$ and will be corrected. Correcting the demodulated symbols G by the parity symbols $p_n$ is achieved by using the non-redundant error detection and correction algorithm which is applied on contiguous DQPSK symbols $x_n$. Correction of parity symbols is performed in the same manner using the parity symbols $p_n$ instead of the demodulated symbols $x_n$, and using the super parity symbols $q_n$ instead of the parity symbols $p_n$. The decision logical unit 407 is applied to the syndrome s(n) and the syndrome s(n−2).

Figure 5:
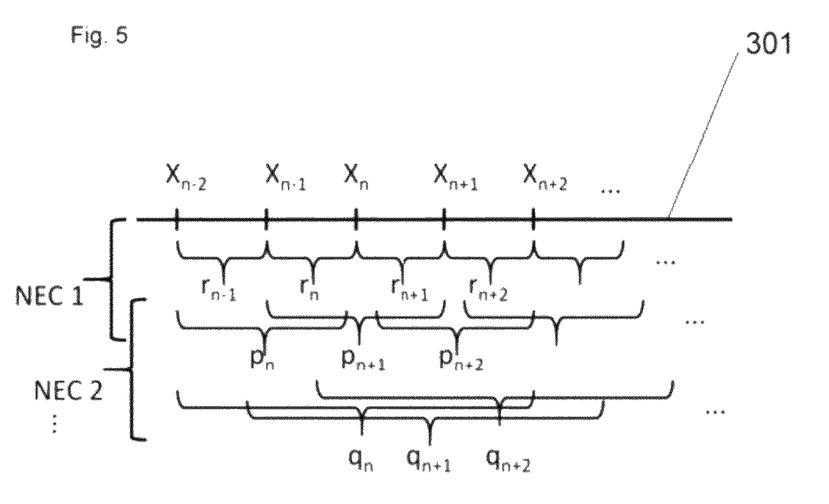
FIG. 5 shows a diagram for assigning DQPSK symbols to demodulation, parity and super-parity symbols according to an implementation form.

FIG. 5 shows a diagram for assigning DQPSK symbols to demodulation, parity and super parity symbols according to an implementation form. A sequence of DQPSK symbols 301 comprises the symbols $x_{n-2}, x_{n-1}, x_n, x_{n+1}, x_{n+2}$. A sequence of demodulated symbols $r_{n-1}, r_n, r_{n+1}, r_{n+2}$ is calculated from the sequence of DQPSK symbols by the relations $r_{n-1} = x_{n-2} x^*_{n-1}$, $r_n = x_{n-1} x^*_n$, $r_{n+1} = x_n x^*_{n+1}$, $r_{n+2} = x_{n+1} x^*_{n+2}$. A sequence of parity symbols $p_n, p_{n+1}, p_{n+2}$ is calculated from the sequence of DQPSK symbols by the relations $p_n = x_{n-2} x^*_n$, $p_{n+1} = x_{n+1}$, $p_{n+2} = x_n x^*_{n+2}$. A sequence of super-parity symbols $q_n, q_{n+1}, q_{n+2}$ is calculated from the sequence of DQPSK symbols by the relations $q_n = x_{n-2} x^*_{n+2}$, $q_{n+1} = x_{n-1} x^*_{n+3}$, $q_{n+2} = x_n x^*_{n+4}$. The method supposes that the parity symbol $p_n$ is correct, i.e. free of errors. But this is not guaranteed. Thus, errors might be introduced to the $r_n$ instead of being corrected. According to the first aspect of the present disclosure, a method is used which makes sure, that the symbols $p_n$ are correct. Therefore, first calculate another parity symbol $q_n$ is calculated which is called the super parity symbol $q_n$, and the non-redundant error correction algorithm is first applied on $p_n$ and $q_n$ and then applied on $r_n$ and the corrected $p_n$. According to implementation forms, this method is extended by making sure that $q_n$ is correct and therefore applying the non-redundant error correction a third time and so on. Compared to the classical non-redundant error correction algorithm, the additional stage does only consider non-adjacent symbols.

According to an implementation form, the device of FIG. 4 is applied to the sequence of DQPSK symbols as depicted in FIG. 5 and used for calculating the super-parity symbols $q_n$, $q_{n+1}$ and $q_{n+2}$ which are then used to correct the parity errors in the sequence of DQPSK symbols by using a non-redundant error correction algorithm NEC2. Afterwards, by using the corrected sequence of DQPSK symbols, the demodulated symbols $r_{n-1}, r_n, r_{n+1}$ and $r_{n+2}$ and the parity symbols $p_n, p_{n+1}, p_{n+2}$ are calculated again and a non-redundant error correction algorithm NEC1 is applied to correct other errors in the demodulated symbols $r_{n-1}, r_{n+1}$ and $r_{n+2}$. Thus, the performance of error correction is improved, as parity symbols used for non-redundant error correction algorithm NEC1 are correct when being used.

Figure 6:
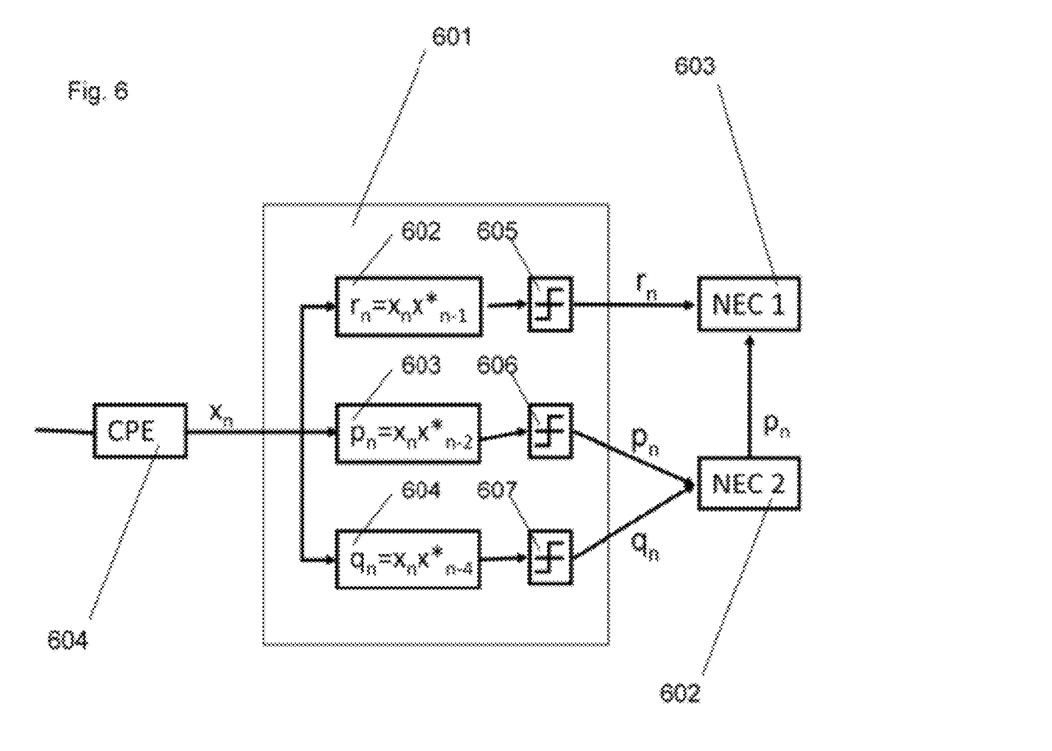
FIG. 6 shows a block diagram of an apparatus for detecting a parity error in a sequence of DQPSK symbols according to an implementation form.

FIG. 6 shows a block diagram of an apparatus for detecting a parity error in a sequence of DQPSK symbols according to an implementation form. The apparatus comprises a determination unit 601 having an input to receive a DQPSK symbol $x_n$ and three outputs to provide a demodulated symbol $r_n$, a parity symbol $p_n$ and a super-parity symbol $q_n$. An optional carrier phase estimation unit 604 provides the DQPSK symbol $x_n$.

The determination unit 601 comprises a first subunit 602 and a first phase detector 605 to determine the demodulated symbol $r_n$ as phase difference between the DQPSK symbol $x_n$ and the DQPSK symbol $x_{n-1}$, which is achieved by multiplication of $x_n$ with the complex conjugate of $x_{n-1}$ in the first subunit 602 and phase detection of $x_n x^*_{n-1}$ in the first phase estimation unit 605. The parity symbol $p_n$ is provided by a second subunit 603 and a subsequent second phase detector 606 for detecting the phase difference between the DQPSK symbol $x_n$ and the DQPSK symbol $x_{n-2}$, which is achieved by multiplying the DQPSK symbol $x_n$ with the complex conjugate of $x_{n-2}$ in the second subunit 603 and phase detection of $x_n x^*_{n-2}$ in the second phase estimation unit 606. The super-parity symbol $q_n$ is provided by a third subunit 604 and a subsequent third phase detector 607 in order to compute the phase difference between the DQPSK symbol $x_n$ and the DQPSK symbol $x_{n-4}$, which is obtained by multiplying the DQPSK symbol $x_n$ by the complex conjugate of DQPSK symbol $x_{n-4}$ in the third subunit 604 and phase detection of $x_n x^*_{n-4}$ in the third phase estimation unit 607.

The apparatus comprises a first correction unit 602 (NEC2) for performing detection and correction of parity errors of the parity symbols $p_n$ and applying corrected parity symbols $p_n$ to a second correction unit 603 (NEC1) for applying error detection and correction of errors of the demodulated symbols $r_n$. According to an implementation form the first correction unit 602 applies a non-redundant error correction (NEC) algorithm for error detection and/or correction of parity errors, i.e. errors in parity symbols $p_n$. According to an implementation form the second correction unit 603 applies a non-redundant error correction algorithm (NEC) for error detection and/or correction of demodulated errors, i.e. errors in demodulated symbols $r_n$, wherein the second correction unit 603 (NEC1) uses parity symbols $p_n$ which have been corrected by the first correction unit 602 (NEC2).

According to some implementation forms, the apparatus performs a third soft decision operation, which is additionally to the classical non-redundant error correction algorithm. This adds one more complex valued soft multiplication to the scheme. However, the operations inside the first correction unit 602 and the second correction unit 603 are only low complexity binary operations and no feedback or recursion is required, such that the non-redundant error correction algorithm complexity and thus, the total computational complexity of the apparatus is negligible.

Figure 7:
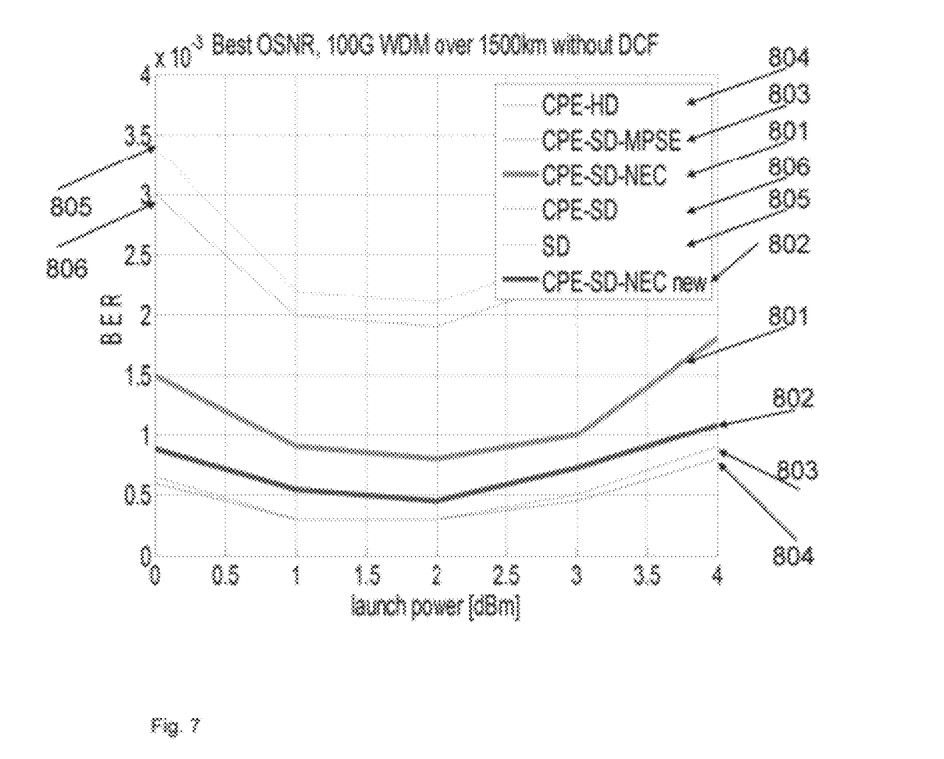
FIG. 7 shows a performance diagram of a method for detecting a parity error in a sequence of DQPSK symbols according to an implementation form.

FIG. 7 shows a performance diagram of a method for detecting a parity error in a sequence of DQPSK symbols according to an implementation. The diagram depicts best optical signal-to-noise ratio (OSNR) for 100 G WDM (Wavelength Division Multiplexing) over 1,500 km without DCF (Dispersion Compensating Fiber) with respect to the launch power in dBm. A first graph 801 illustrates carrier phase estimation with the soft differential decoding and non-redundant error correction algorithm (CPE-SD-NEC). A second graph 802 illustrates carrier phase estimation with the soft differential decoding and non-redundant error correction algorithm of the new version (CPE-SD-NEC new) according to embodiments described in this application. A third graph 803 illustrates carrier phase estimation with the soft differential decoding and multi-symbol phase estimation algorithm (CPE-SD-MPSE). A fourth graph 804 illustrates carrier phase estimation with the hard differential decoding algorithm (CPE-HD). A fifth graph 805 illustrates the soft differential decoding algorithm (SD). A sixth graph 806 illustrates carrier phase estimation with the soft differential decoding algorithm (CPE-SD).

According to implementation forms, a coherent receiver having a DSP (digital signal processor) detects a differentially encoded, QPSK modulated signal. Implementation forms use differential decoding to avoid error bursts induced by phase slips. A soft differential (SD) decoding, according to implementation forms, proves excellent tolerance against non-linear phase noise, in particular for highly transmission with 10 Gbit/s OOK (On-Off Keying) neighbors. Differential decoding, however, introduces a bit error rate (BER) penalty in the back-to-back case. In case of soft differential encoding, two consecutive receive values are multiplied before a decision is made. Thus, the total noise power is doubled, which translates into a back-to-back OSNR (optical signal-to-noise ratio) degradation of about 2.7 dB at a bit error rate (BER) of about 1e-3.

Non-redundant error correction (NEC), according to implementation forms, is known to reduce this penalty. However, its performance cannot mitigate the full SD penalty. Soft differential decoding, illustrated by the graphs 803, 801, 806, 805 and 802 is used to improve the performance. Soft differential decoding combined with non-redundant error correction, according to implementation forms, allows to improve the optical signal-to-noise ratio by more than 1 dB. Due to its low complexity, implementation forms using NEC are used in product development.

The graph 802 is according to an implementation form avoiding the intrinsic error propagation of the classical non-redundant error correction and therefore improves the performance. It nearly reaches the back-to-back (B2B) performance of hard differential (HD) decoding. However, it shall be mentioned that HD decoding may fail in the presence of non-linear phase noise. Only under unrealistic ideal conditions with feed forward carrier recovery as can be seen by graph 804 in FIG. 7, HD decoding performs better than SD decoding. The graph 801 illustrates state of the art non-redundant error correction, while the graph 802 illustrates non-redundant error correction according to implementation forms of embodiments of the present disclosure. Thus, implementation forms detecting and correcting parity errors before correcting demodulated errors, see graph 802 perform better in terms of bit error rate (BER) than state of the art non-redundant error correction schemes with soft decision, see graph 801. The differential penalty is almost compensated by said implementation forms, as can be seen by the graph 802. Therefore, implementation forms deliver improved mitigation of the SD penalty at a low complexity. Similar performances can be obtained for all methods using soft-differential decoding, when no CPE is applied. Hard-differential decoding completely fails in this case.

According to an implementation in high-speed transmission systems, the parallel processing architecture and processing delay in digital feed-forward loops and feed-back loops reduce the tracking speed of the digital carrier recovery stage such that significant nonlinear phase noise may be present after the CPE stage, which is effectively mitigated by soft-differential decoding and subsequent NEC. Further implementation details are disclosed in Fabian. N. Hauske, Zhuhong Zhang, Chuandong Li, Yanjun Zhu, Yanming Li, Fei Zhu, Yusheng Bai "Nonlinear Phase Noise Mitigation with Soft-Differential Decoding and Non-redundant Error Correction for Hybrid 10G/100G Transmission" accepted for publication in Photonics Technology Letters, April, 2011, which is incorporated herein by reference.

It will be apparent to those skilled in the art that various modifications and variations can be made in the disclosed embodiments without departing from the scope or spirit of the present disclosure. Other embodiments of the present disclosure will be apparent to those skilled in the art from consideration of the specification and practice of the present disclosure disclosed herein. It is intended that the specification and examples be considered as exemplary only, with a true scope and spirit of the present disclosure being indicated by the following claims.

The invention claimed is:

1. A method for detecting a parity error in a sequence of differential quadrature phase-shift keying (DQPSK) symbols of a digital transmission system, comprising:

determining a first demodulated symbol $r_1$ as a parity between a first DQPSK symbol x(n−2) and a second DQPSK symbol x(n−1);

determining a second demodulated symbol $r_2$ as a parity between the second DQPSK symbol x(n−1) and a third DQPSK symbol x(n), wherein the first x(n−2), the second x(n−1) and the third x(n) DQPSK symbols are contiguous symbols of the sequence of DQPSK symbols;

determining a first parity symbol $p_1$ as a parity between a fourth DQPSK symbol x(n−k) and the third DQPSK symbol x(n);

determining a second parity symbol $p_2$ as a parity between a fifth DQPSK symbol x(n−k−m) and the fourth DQPSK symbol x(n−k), wherein the third x(n), the fourth x(n−k) and the fifth x(n−k−m) DQPSK symbols are different and non-contiguous symbols of the sequence of DQPSK symbols;

determining a super-parity symbol $q_1$ as a parity between the fifth DQPSK symbol x(n−k−m) and the third DQPSK symbol x(n); and detecting a parity error in the sequence of DQPSK symbols by comparing a combination of the first parity symbol $p_1$ and the second parity symbol $p_2$ against the super-parity symbol $q_1$, wherein a parity between two DQPSK symbols describes a phase difference between the two DQPSK symbols.

2. The method of claim 1, wherein the parity between two DQPSK symbols is determined by a threshold decision applied to a product of a first of the two DQPSK symbols and a complex conjugate of a second of the two DQPSK symbols.

3. The method of claim 1, wherein the parity between two non-contiguous DQPSK symbols of a sequence of DQPSK symbols is determined by a sum of sub-parities which are parities between individual symbols ranging from a first of the two non-contiguous DQPSK symbols to a second of the two non-contiguous DQPSK symbols.

4. The method of claim 3, wherein a step-size between two of the individual symbols used for determining the sub-parities differs for at least two of the sub-parities.

5. The method of claim 3, wherein a number of sub-parities for determining a parity between the fourth DQPSK symbol $x(n-k)$ and the third DQPSK symbol $x(n)$ is equal to a number of sub-parities for determining a parity between the fifth DQPSK symbol $x(n-k-m)$ and the fourth DQPSK symbol $x(n-k)$.

6. The method of claim 3, wherein a number of sub-parities for determining a parity between the fifth DQPSK symbol $x(n-k-m)$ and the third DQPSK symbol $x(n)$ is an integer multiple of a number of sub-parities for determining a parity between the fourth DQPSK symbol $x(n-k)$ and the third DQPSK symbol $x(n)$.

7. The method of claim 1, wherein detecting a parity error comprises determining a first syndrome $s_1$ as a function of the first parity symbol $p_1$, the second parity symbol $p_2$ and the super-parity symbol $q_1$, wherein a parity error is detected if the first syndrome $s_1$ is unequal to zero.

8. The method of claim 7, further comprising
determining a second syndrome $s_2$ as a function of the second parity symbol $p_2$, a third parity symbol $p_3$ and a second super-parity symbol $q_2$, wherein a parity error is detected if the second syndrome $s_2$ is unequal to zero; and
correcting the parity error by using the first syndrome $s_1$ and the second syndrome $s_2$.

9. The method of claim 8, wherein the parity error is corrected by Non-redundant Error Correction.

10. The method of claim 8, further comprising:
detecting a demodulation error in the sequence of DQPSK symbols in which the parity error has been corrected by comparing a combination of the first demodulated symbol $r_1$ and the second demodulated symbol $r_2$ against the first parity symbol $p_1$.

11. The method of claim 1 further comprising:
determining a second super-parity symbol $q_2$ as a parity between a sixth DQPSK symbol $x(n-k-m-q)$ and the fifth DQPSK symbol $x(n-k-m)$;

determining a hyper-parity symbol $v_1$ as a parity between the sixth DQPSK symbol $x(n-k-m-q)$ and the third DQPSK symbol $x(n)$; and
detecting a super-parity error in the sequence of DQPSK symbols by comparing a combination of the super-parity symbol $q_1$ and the second super-parity symbol $q_2$ against the hyper-parity symbol $v_1$.

12. The method of claim 11, wherein the super-parity error is first corrected by Non-redundant Error Correction, and wherein the parity error is thereafter corrected by Non-redundant Error Correction and at last the demodulation error is corrected by Non-redundant Error Correction.

13. Apparatus for detecting a parity error in a sequence of differential quadrature phase-shift keying (DQPSK) symbols of a digital transmission system, comprising:
a determination unit configured to determine a first demodulated symbol $r_1$ as a parity between a first DQPSK symbol $x(n-2)$ and a second DQPSK symbol $x(n-1)$, and determine a second demodulated symbol $r_2$ as a parity between the second DQPSK symbol $x(n-1)$ and a third DQPSK symbol $x(n)$,
wherein the first $x(n-2)$, the second $x(n-1)$ and the third $x(n)$ DQPSK symbols are contiguous symbols of the sequence of DQPSK symbols;
wherein the determination unit is further configured to determine a first parity symbol $p_1$ as a parity between a fourth DQPSK symbol $x(n-k)$ and the third DQPSK symbol $x(n)$, and determine a second parity symbol $p_2$ as a parity between a fifth DQPSK symbol $x(n-k-m)$ and the fourth DQPSK symbol $x(n-k)$,
wherein the third $x(n)$, the fourth $x(n-k)$ and the fifth $x(n-k-m)$ DQPSK symbols are different and non-contiguous symbols of the sequence of DQPSK symbols;
wherein the determination unit is further configured to determine a super-parity symbol $q_1$ as a parity between the fifth DQPSK symbol $x(n-k-m)$ and the third DQPSK symbol $x(n)$; and
a detection unit configured to detect a parity error in the sequence of DQPSK symbols by comparing a combination of the first parity symbol $p_1$ and the second parity symbol $p_2$ against the super-parity symbol $q_1$,
wherein a parity between two DQPSK symbols describes a phase difference between the two DQPSK symbols.

14. The apparatus of claim 13, further comprising
a correction unit configured to correct the parity error in the sequence of DQPSK symbols by Non-redundant Error Correction.

15. The apparatus of claim 13, wherein the detection unit is further configured to detect
a demodulation error in the sequence of DQPSK symbols by comparing a combination of the first demodulated symbol $r_1$ and the second demodulated symbol $r_2$ against the first parity symbol $p_1$; and
wherein the correction unit is further configured to correct the demodulation error by Non-redundant Error Correction.

* * * * *